(12) United States Patent
Jackson

(10) Patent No.: US 7,102,345 B2
(45) Date of Patent: Sep. 5, 2006

(54) PORTABLE VI PROBE

(75) Inventor: Robert Jackson, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 10/373,777

(22) Filed: Feb. 27, 2003

(65) Prior Publication Data

US 2004/0027113 A1 Feb. 12, 2004

Related U.S. Application Data

(60) Provisional application No. 60/359,986, filed on Feb. 28, 2002, provisional application No. 60/360,016, filed on Feb. 28, 2002, and provisional application No. 60/259,862, filed on Jan. 8, 2001.

(51) Int. Cl.
*G01R 31/02* (2006.01)

(52) U.S. Cl. .................. 324/72.5; 324/149; 324/95
(58) Field of Classification Search .................. 324/72, 324/72.5, 95, 149, 757; 439/387, 444, 391–425; 455/67.11–67.16, 67.7, 226
See application file for complete search history.

(56) References Cited

U.S. PATENT DOCUMENTS

| | | | | | |
|---|---|---|---|---|---|
| 4,090,130 | A | * | 5/1978 | Willenbecher, Jr. | 324/126 |
| 5,274,336 | A | * | 12/1993 | Crook et al. | 324/690 |
| 5,467,013 | A | * | 11/1995 | Williams et al. | 324/127 |
| 5,808,415 | A | * | 9/1998 | Hopkins | 315/111.21 |
| 6,624,622 | B1 | * | 9/2003 | Noh | 324/72.5 |

* cited by examiner

*Primary Examiner*—Vincent Q. Nguyen
(74) *Attorney, Agent, or Firm*—Oblon, Spivak, McClelland, Maier & Neustadt, P.C.

(57) ABSTRACT

A portable voltage and current (VI) probe including voltage and current probes, a clamshell assembly, and insulation sections for attachment to at least one transmission line. A stripper tool removes sections of a cover and a shield from the transmission line. Probes are then installed onto the transmission line. A clamshell assembly is placed onto the exposed transmission line surrounding the probes. The probes are insulated and connected to at least one detecting circuit.

30 Claims, 5 Drawing Sheets

PORTABLE VI PROBE

CROSS-REFERENCES TO RELATED APPLICATIONS

The present application claims priority and is related to U.S. provisional application Ser. No. 60/359,986, filed on Feb. 28, 2002. The present application is related to U.S. provisional application Ser. No. 60/259,862, entitled "Capacitively coupled RF voltage probe", Attorney docket No. 71469/274089 PROV, filed on Jan. 8, 2001; and co-pending U.S. provisional application Ser. No. 60/360,016, entitled "Integrated VI probe,", filed on Feb. 28, 2002. The contents of all of those applications are incorporated herein by reference in their entirety.

BACKGROUND OF THE INVENTION

1. Field of the Invention

The present invention relates to a Portable Voltage and Current (VI) Probe for attachment to at least one transmission line.

2. Discussion of the Background

In the fabrication and processing of semi-conductor wafers, such as silicon wafers, a variety of different semi-conductor equipment and processes can be utilized. For example, wafer processing techniques are known in the art and may include, for example, photolithography, ion beam deposition, vapor deposition, etching, as well as a variety of other processes.

In one method of wafer processing, plasma generators are used to process a wafer, for example by etching a layer formed on the surface of the wafer. In employing this technique, electrical power is coupled to the plasma generator from an electrical source. Typically, the electrical energy has a frequency in the radio frequency (RF) range. Control of the process is performed in part by measuring and monitoring the RF voltage and the RF current components of the RF power source coupled to the plasma generator. It is generally desirable to obtain the voltage and current measurements as close to the plasma generator as possible in order to obtain a true representation of the actual RF voltage and current entering the plasma generator with minimal effects on the transmission line. Therefore, a common practice for measuring RF power is to install a sensor for monitoring current and voltage in series with the transmission medium coupling the RF power to the plasma generator.

However, RF monitors can disrupt the plasma process or may fail to obtain accurate indications of the ongoing plasma process. Furthermore, the monitor itself may affect the RF signal due to reflections, for example. Due to different system configurations, it is desirable to be able to measure the RF power at various locations along the transmission line using a portable probe as opposed to using a probe which is integrated into the transmission line.

Consequently, there exists a need for a portable VI probe for monitoring a source of RF electrical power, which minimally intrudes in the RF transmission line in which the probe is placed.

SUMMARY OF THE INVENTION

A need exists for a VI probe which is portable and can be installed at any point along a transmission line in a plasma generator.

Therefore, an exemplary embodiment of this invention provides for an apparatus and a system for installing the apparatus which can detect voltage and current within a transmission line of a plasma generator and which is portable. A transmission line is stripped of sections of its cover and its shield, and probes are installed against the transmission line's innermost insulator. A clamshell assembly then surrounds the exposed transmission line and the probes. The probes are insulated and connected to a detecting circuit. The innermost insulator and the inner conductor are not stripped and are left intact.

One benefit of using the present invention is a decrease in losses and reflections compared to using coaxial connectors, since the inner conductor and dielectric are never broken, and the discontinuities of the outer conductor are minimal.

Another benefit is that the assembly can be made physically shorter than a similar probe having coaxial connectors on both ends and mating two coaxial cables also equipped with connectors.

A third benefit is that several parts of the clamshell assembly can be replaced with other parts having different characteristics.

Other objects, features and advantages of the present invention will become apparent from the following detailed description, the accompanying drawings, and the appended claims.

BRIEF DESCRIPTION OF THE DRAWINGS

A more complete appreciation of the invention and many of the attendant advantages thereof will become readily apparent with reference to the following detailed description particularly when considered in conjunction with the accompanied drawings, in which.

DETAILED DESCRIPTION OF THE INVENTION

Figure 3:
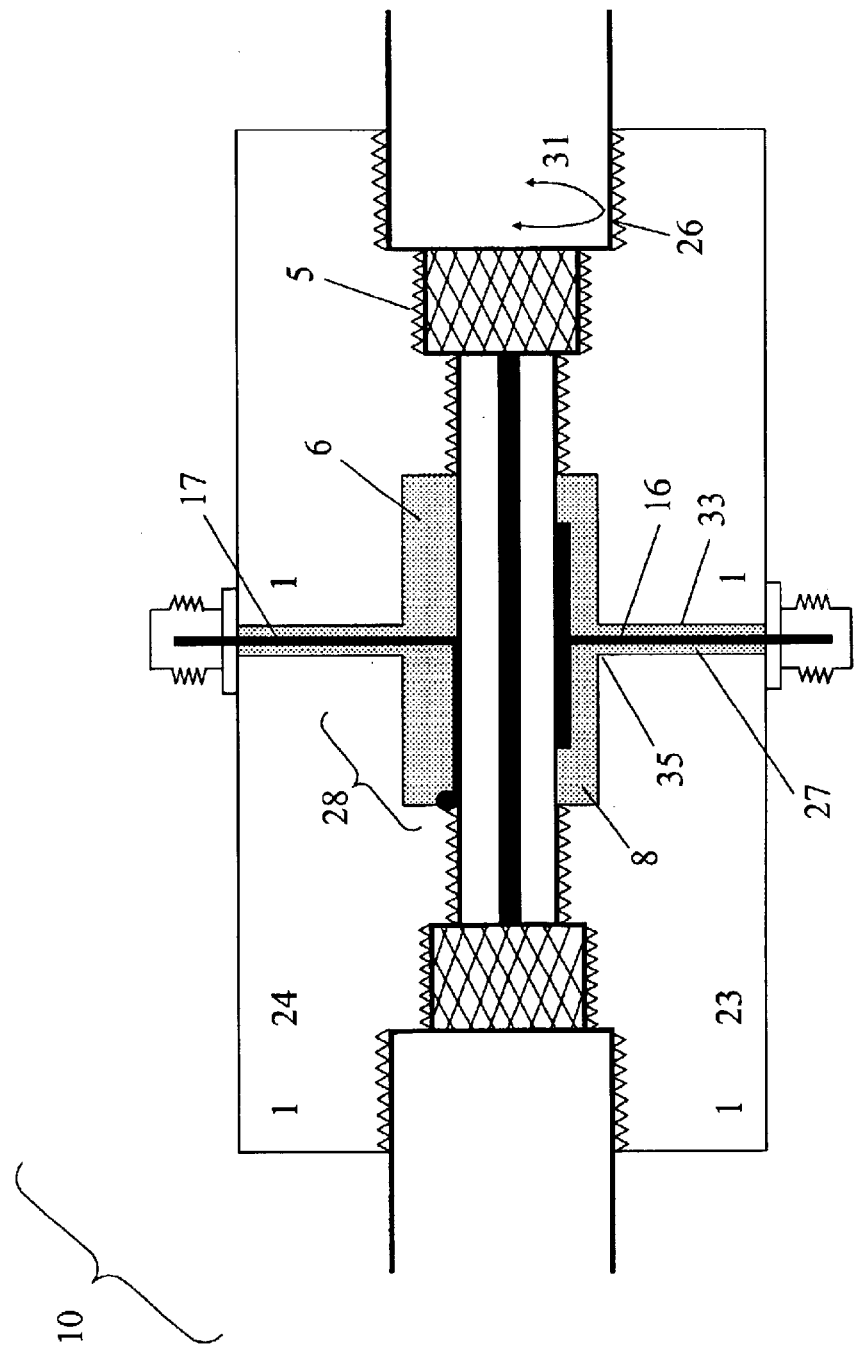
FIG. 3 is a side view of the clamshell assembly and the transmission line showing the connection of a voltage probe and a current probe to the transmission line.
Figure 4:
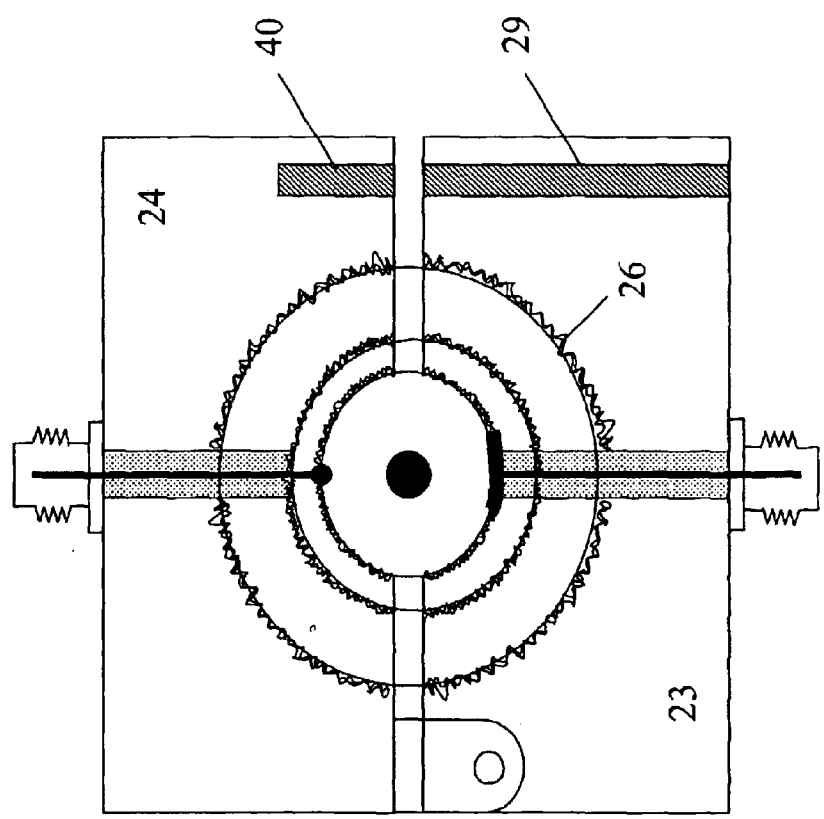
FIG. 4 is an end view of the clamshell assembly and the transmission line showing the connection of a voltage probe and a current probe to the transmission line.

A portable VI probe can be made to clamp onto a transmission line and provide RF voltage and current information. As shown in FIG. 3, the portable VI probe 10 comprises several independent elements including probes 16 and 17, a clamshell assembly 1, and insulation sections 6, 8.

Figure 1:
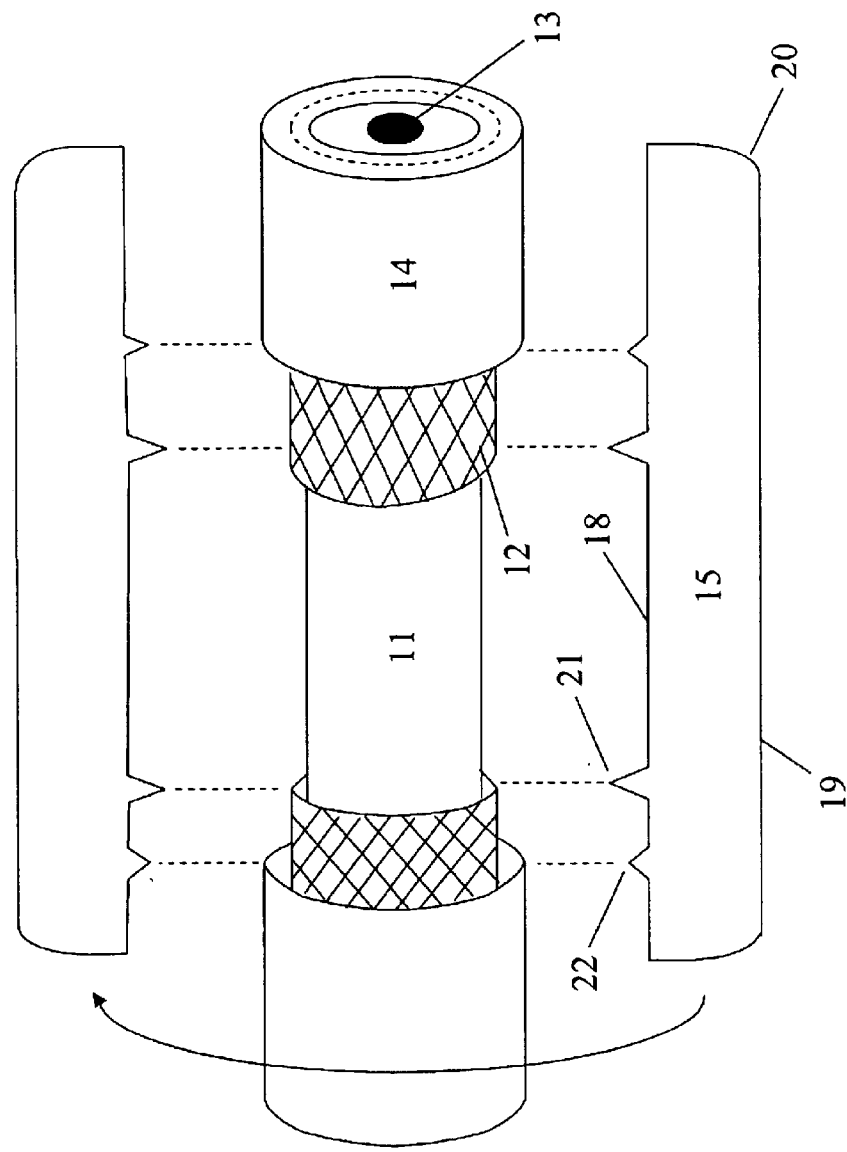
FIG. 1 is a side view of a transmission line in which sections of the cover and the shield have been removed by the stripper tool.

As shown in FIG. 1, a stripper tool 15 is configured to strip a cover and a shield away from the transmission line. The innermost insulator 11 and the inner conductor 13 are not stripped and are left intact.

The stripper tool includes a flat edge 18. The opposite edge 19 and the ends 20 are rounded and can be held. The depth of the tool is substantially small compared to the length of the flat edge 18. Protruding out from the flat edge are a first pair of cutting juts 21 whose heights measured from a tip of the cutting surface to the flat edge of the stripper tool are equal to the radial depth of the inner circumference of the shield 12. A second pair of cutting juts 22 also protrudes from the flat edge. The heights of the cutting juts 22 are equal to the radial depth of the inner circumference of the cover 14. Alternatively, the transmission line may comprise multiple shields and the stripper tool can comprise additional cutting juts to strip the shields away from the transmission line. Also, the transmission line can comprise a metallic outer layer (conductor) and the stripper tool may comprise a single cutting jut to strip the metallic outer layer away from the transmission line.

The structures of the probes are disclosed in application Ser. No. 60/259,862, entitled "Capacitively coupled RF voltage probe".

Figure 2A:
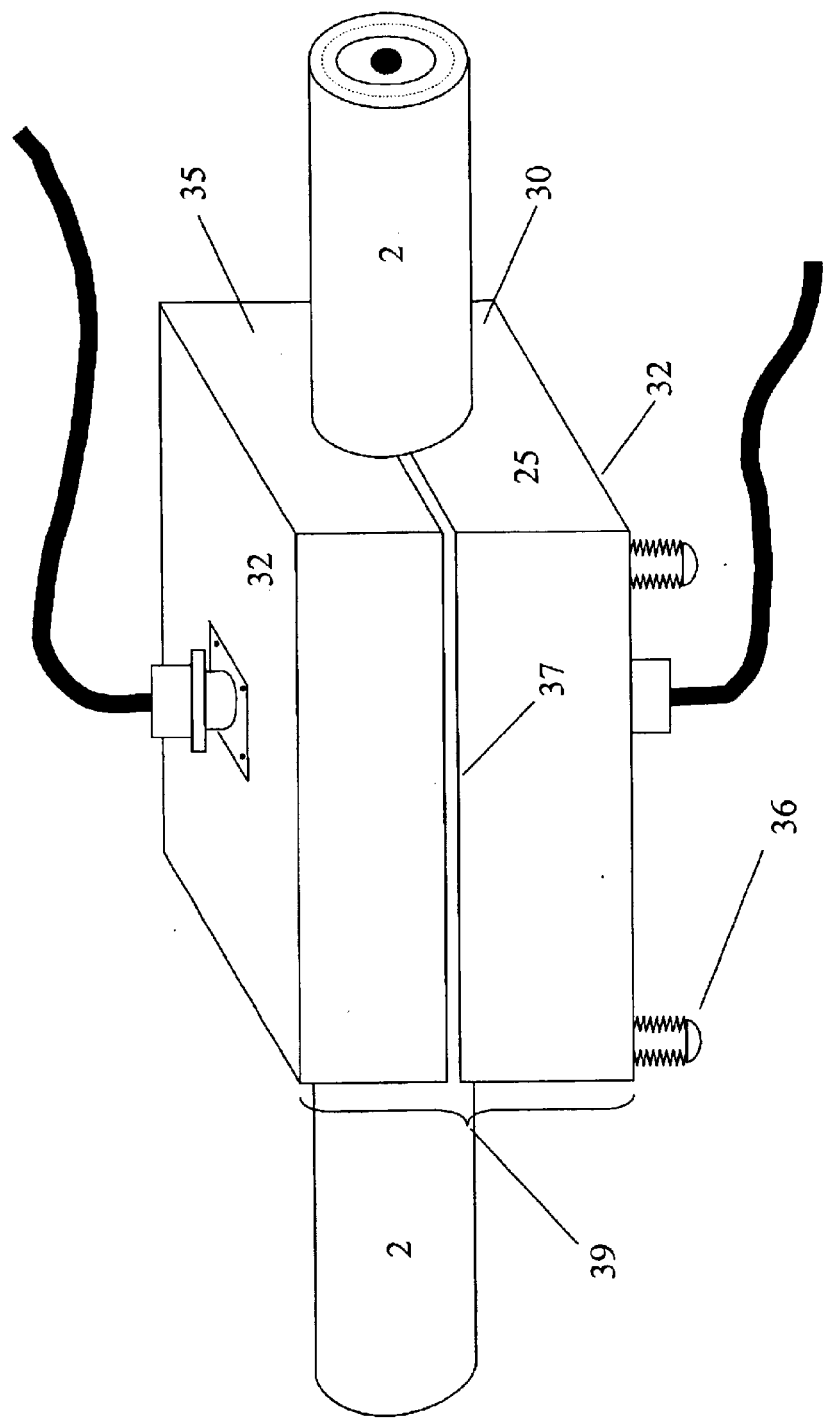
FIG. 2A is a perspective view of the clamshell assembly and the transmission line.
Figure 2B:
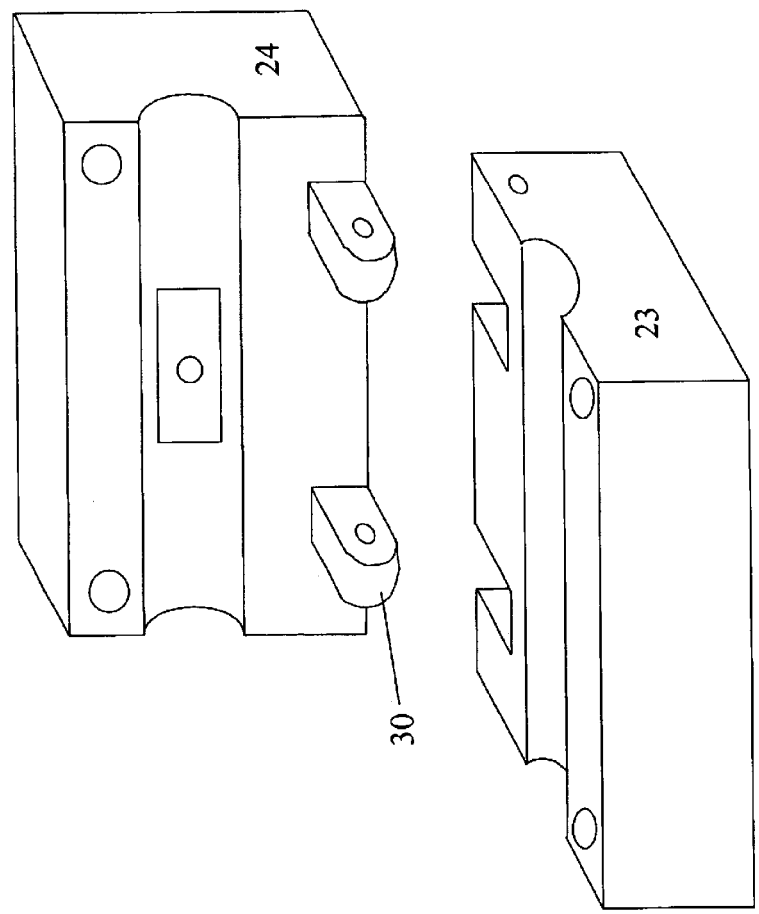
FIG. 2B is a perspective view of the clamshell assembly and the hinge.

With reference to FIGS. 2A, 2B, 3 and 4 the clamshell assembly 1 will now be described. The first half 23 of the clamshell assembly 1 includes a box 25; a groove (e.g., having a fractionally cylindrical shape) 26; a through-hole 27; an overhang section 28 (FIG. 2B); a screw-hole 29 (FIG. 4); and a hinge section 30 (FIG. 2B).

The clamshell assembly 1 will normally be in one of two positions. In the first position 39 (FIG. 2A), the clamshell assembly is closed. The clamshell assembly surrounds a transmission line and probes that are connected to the transmission line. The clamshell assembly is held in this position by a hinge and at least one fastener, each of which will be discussed in greater detail below.

The clamshell assembly 1 can also be in the open, second position, as shown in FIG. 2B. Here, the fastener (e.g., screw) and the hinge have not been employed and activated, respectively. Before attachment, the clamshell assembly does not surround the transmission line or any probes connected to the transmission line.

The groove 26 (FIG. 3) preferably has an arc length 31 substantially similar to the arc length of the outer circumference of the transmission line and extends along a length of the surface of the box allowing the transmission line to be partially inserted into the surface. A possible embodiment will include secondary grooves 5 running in a perpendicular direction with respect to the groove along the groove in order to make a tighter electrical and mechanical connection to the transmission line.

The through-hole 27 (FIG. 3) should be wide enough to allow the clamshell assembly to be installed onto the transmission line. The through-hole extends from substantially the center of the groove to the opposite surface 32 (FIG. 2A) of the box. The throughhole is further defined by walls 33 (FIG. 3) extending from the groove to the opposite surface of the box.

An overhang section 28 (FIG. 3) is disposed at a conjunction of the through-hole 27 and the groove. The diameter of overhang section is somewhat larger than the diameter of the through-hole. Thus, the lip 35 of the overhang section of the box would be visible to a hypothetical observer standing inside the transmission line.

At least one screw-hole 29 and 40 (FIG. 4) passes between the first and second halves 23 and 24. The screw-hole 29 and 40 is preferably configured to cooperate with a screw 36 (FIG. 2A) that is substantially small in diameter compared to the length of the screw-hole 29 and 40.

The second half 24 of the clamshell assembly resembles the first half. One difference being that the length of the screw-holes 40 in the second half need not be equal to the entire depth of the box. Rather the screw-holes may only extend into the second half as deeply as necessary to securely fasten the clamshell assembly in the closed position.

The two halves 23, 24 of the clamshell assembly are held together by a hinge 30. Alternatively, the assembly could be held together by a plurality of screws and bolts (not shown).

The clamshell assembly further includes fasteners, such as screws configured to screw into the at least one screw-hole when the clam shell assembly is closed. In a known way, the fastener(s) force(s) the clamshell assembly to remain closed.

Now, the insulation sections 6, 8 will be described. The insulation sections 6, 8 are preferably made from compressible material that fills space between the probes and the through-holes in each half of the clamshell assembly.

When the clamshell assembly is closed, the overhang second of each half exerts an inward radial force against the probes holding them still. Moreover the insulation prevents the probes from coming into contact with the walls of the through-holes and therefore the electrical signals the probes produce are unaffected.

The structure of an apparatus for connecting the probes to a detecting circuit is described in Application Ser. No. 60/259,862. The detecting circuit therein is a high impedance RF monitor. That application also discloses that the distance between the probes to the detecting circuit should not affect the output of the detecting circuit, but the distance between the probes and the plasma generator is important. Thus, the need for a portable probe is illustrated.

Following installation, the clamshell assembly becomes a part of the outer conductor of the transmission line, which is at ground potential. Electrical contact between the clamshell assembly and the outer conductor minimizes the radiation of RF fields propagating through the transmission line.

The method of installing the portable VI probe will now be described. The method of installing the portable VI probe comprises five steps. They are: using the stripper tool 15 to strip the transmission line 2; attaching probes to the transmission line; installing a clamshell assembly onto the transmission line 1; insulating the probes; and connecting the probes to at least one detecting circuit (not shown).

The method of employing the stripper tool to strip the transmission line includes first inserting the cutting surface of the first pair of cutting juts 21 extending from the flat surface of the stripper tool into the transmission line. Next, the stripper tool is moved about the transmission line in a substantially circumferential direction until the cutting juts, which will seem to a hypothetical observer looking down the transmission line axially, have penetrated the transmission line to a depth allowing a second pair of cutting jets to contact the transmission line. The stripper tool is continued to be moved around the transmission line as above until the first and second pair of cutting juts have removed a section of the cover and the shield of the transmission line as shown in FIG. 1.

Where the transmission line is constructed to resemble triax cable and comprises multiple shields, the stripper tool will be designed accordingly. The use of the stripper tool for triax cable will be substantially similar to the use described above. Where the transmission line is semi-rigid and comprises an inner conductor, an insulator and a metallic cover, the stripper tool will be designed accordingly. The use of the stripper tool for a semi-rigid transmission line will also be substantially similar to the use described above.

Additional information about the method of installing the probes onto the transmission line can be found in Application Ser. No. 60/259,862.

Now, the process of installing the clamshell assembly onto the transmission line will be discussed. First, the transmission line is positioned integrally into the groove of the first half of the clamshell assembly. At this point, a probe attached to the transmission line may penetrate the throughhole in the first half of the clamshell assembly. A force is then exerted onto the second half of the clamshell so the second half of the clamshell assembly comes into contact with the transmission line along the groove of the second half of the clamshell assembly. At this point, a probe attached to the transmission line may penetrate the through-hole in the second half of the clamshell assembly. Finally, at least one screw is inserted into at least one screw-hole of the clamshell assembly to tighten the connection between the two halves of the clamshell assembly as shown in FIG. 2.

Insulating the voltage probe and the current probe will now be described. Insulating material is provided between the probes so that the clamshell assembly exerts an inward radial force against the insulating material. For a description of an injection system for the insulating material, please refer to Application Ser. No. 60/259,862.

Although the above description has been given in terms of a voltage probe and a current probe integrated within the same clamshell device, two clamshell devices may be used to separately house a voltage probe away from a current probe.

Numerous modifications and variations of the present invention are possible in light of the above teachings. It is therefore to be understood that, within the scope of the appended claims, the invention may be practiced otherwise than as specifically described herein.

What is claimed is:

1. A portable voltage probe, for attachment to at least one transmission line having an inner conductor, an insulator over the inner conductor, a shield over the insulator, and a cover over the shield, comprising:
    a voltage probe configured to detect a voltage in the transmission line;
    a clamshell assembly made of a conductive material and configured to be in electrical contact with said shield in order to reduce radiation of RE fields propagating through the transmission line, said clamshell assembly being configured to house the voltage probe such that the voltage probe is in physical contact with said insulator and capacitively coupled to the inner conductor; and
    an insulation section configured to electrically insulate the voltage probe from the clamshell assembly.

2. The portable voltage probe according to claim 1, wherein the transmission line includes multiple shields and said clamshell assembly is in electrical contact with at least one of the multiple shields.

3. The portable voltage probe according to claim 1, wherein the transmission line is semi-rigid and has a metallic cover that said clamshell is in electrical contact with.

4. The portable voltage probe according to claim 1, further comprising:
    a hinge attaching to the clamshell assembly.

5. The portable voltage probe according to claim 1, further comprising a screw and a screw-hole substantially perpendicular to a direction of the transmission line for maintaining the clamshell in a closed position.

6. The portable voltage probe according to claim 1, further comprising at least one detecting circuit connected to the voltage probe.

7. The portable voltage probe according to claim 1, wherein the clamshell comprises a first half comprising:
    a groove;
    a through-hole, defined by walls extending from the groove to the opposite surface of the box, extending from substantially the center of the groove to the opposite surface of the box; and
    an overhang section disposed at a conjunction of the through-hole and the groove configured to exert an inward force on the insulation section.

8. The portable voltage probe according to claim 7, wherein the clamshell comprises a second half comprising:
    a groove.

9. The portable voltage probe according to claim 8, wherein the groove of the second half comprises a fractionally cylindrical groove.

10. The portable voltage probe according to claim 7, wherein the insulation section comprises:
    slightly compressible material which is configured to fill a space between the voltage probe and the walls of the through-hole and the overhang section of the first half of the clamshell assembly, wherein:
    when the clamshell assembly is closed the overhang section of the first half exerts an inward radial force against the voltage probe, and
    the voltage probe is prevented from contacting the walls of the through-hole.

11. The portable voltage probe according to claim 7, wherein the groove of the first half comprises a fractionally cylindrical groove.

12. A portable voltage probe, for attachment to at least one transmission line having an inner conductor, a shield, an outer conductor, and a cover, comprising:
    a voltage probe configured to detect a voltage in the transmission line;
    a clamshell assembly configured to house the voltage probe; and
    an insulation section configured to insulate the voltage probe from the clamshell assembly, wherein the portable voltage probe further comprises a stripper tool configured to strip the cover and the shield away from the transmission line, the stripper tool comprising:
    a first pair of cutting juts having heights equal to the radial depth of the inner circumference of the shield, and
    a second pair of cutting juts having heights equal to the radial depth of the inner circumference of the cover.

13. A method of installing a portable voltage probe according to claim 15, wherein the step of installing the clamshell assembly onto the transmission line comprises:
    positioning the transmission line integrally in the groove of the clamshell assembly; and
    securing the transmission line in the clamshell assembly by inserting a screw into a screw-hole of the clamshell assembly.

14. A method of installing a portable voltage probe according to claim 12, wherein the step of insulating a probe comprises providing insulating material between the voltage probe and the through-hole of the clamshell assembly by injecting insulating material into the through-hole of the clamshell assembly.

15. A method of installing a portable voltage probe, comprising:
    stripping the cover and shield away from a transmission line;
    attaching a voltage probe to the transmission line;
    installing a clamshell assembly onto the transmission line, wherein the clamshell assembly comprises a groove for receiving a portion of the transmission line, and a through-hole for connecting the voltage probe from the transmission line to an exterior of the clamshell, and a connector for maintaining the clamshell in a closed portion; and insulating the voltage probe with an insulating material to prevent contact with the clamshell assembly, wherein the step of stripping comprises:

inserting a cutting surface of a first pair of cutting juts attached to a stripper tool into the transmission line;

moving the stripper tool around the transmission line intil the stripper tool penetrates the transmission line to a depth allowing a second pair of cutting juts to contact the transmission line; and moving the stripper tool around the transmission line until the first and second pair of cutting juts penetrate the transmission line.

16. A portable current probe, for attachment to at least one transmission line having an inner conductor, an insulator over the inner conductor, a shield over the insulator, and a cover over the shield, comprising:

a current probe configured to detect a current in the transmission line;

a clamshell assembly made of a conductive material and configured to be in electrical contact with said shield in order to reduce radiation of RF fields propagating through the transmission line, said clamshell assembly being configured to house the current probe such that the current probe is in physical contact with said insulator and capacitively coupled to the inner conductor; and an insulation section configured to electrically insulate the current probe from the clamshell assembly.

17. The portable current probe according to claim 16, wherein the transmission line includes multiple shields and said clamshell assembly is in electrical contact with at least one of the multiple shields.

18. The portable current probe according to claim 16, wherein the transmission line is semi-rigid and had a metallic cover that said clamshell is in electrical contact with.

19. The portable current probe according to claim 16, further comprising:

a hinge attaching to the clamshell assembly.

20. The portable current probe according to claim 16, further comprising a screw and a screw-hole substantially perpendicular to a direction of the transmission line for maintaining the clamshell in a closed position.

21. The portable current probe according to claim 16, further comprising at least one detecting circuit connected to the current probe.

22. The portable current probe according to claim 16, wherein the clamshell comprises a first half comprising:

a groove;

a through-hole, defined by walls extending from the groove to the opposite surface of the box, extending from substantially the center of the groove to the opposite surface of the box; and an overhang section disposed at a conjunction of the through-hole and the groove configured to exert an inward force on the insulation section.

23. The portable current probe according to claim 22, wherein the clamshell comprises a second half comprising:

a groove.

24. The portable current probe according to claim 23, wherein the groove of the second half comprises a fractionally cylindrical groove.

25. The portable current probe according to claim 22, wherein the insulation section comprises:

slightly compressible material which is configured to fill a space between the current probe and thee walls of the through-hole and the overhang section of the first half of the clamshell assembly, wherein:

when the clamshell assembly is closed the overhang section of the first half exerts an inward radial force against the current probe, and the current probe is prevented from contacting the walls of the through-hole.

26. The portable current probe according to claim 23, wherein the groove of the first half comprises a fractionally cylindrical groove.

27. The method of installing a portable current probe to a transmission line having an inner conductor, an insulator over the inner conductor, a shield over the insulator, and a cover over the shield, comprising:

stripping the cover and shield away from the transmission line;

placing a current probe in physical contact with the insulator of the transmission line;

installing an electrically conductive clamshell assembly onto the transmission line, wherein the clamshell assembly comprises:

28. A method of installing a portable current probe according to claim 27, wherein the step of installing the clamshell assembly onto the transmission line comprises:

positioning the transmission line integrally in the groove of the clamshell assembly; and securing the transmission line on the clamshell assembly by inserting a screw into a screw-hole of the clamshell assembly.

29. A method of installing a portable current probe according to claim 27, wherein the step of insulating a probe comprises providing insulating material between the current probe and the through-hole of the clamshell assembly by injecting insulating material into the through-hole of the clamshell assembly.

30. A method of installing a portable voltage probe, comprising:

stripping a cover and a shield away from a transmission line;

attaching a voltage probe to the transmission line;

installing a clamshell assembly onto the transmission line, wherein the clamshell assembly comprises a groove for receiving a portion of the transmission line, and a through-hole for connecting the voltage probe from the transmission line to an exterior of the clamshell, and a connector for maintaining the clamshell in a closed portion; and insulating the voltage probe with an insulating material to prevent contact with the clamshell assembly, wherein the step of stripping comprises:

inserting a cutting surface of a first pair of cutting juts attached to a stripper tool into the transmission line;

moving the stripper tool around the transmission line until the stripper tool penetrates the transmission line to a depth allowing a second pair of cutting juts to contact the transmission line; and moving the stripper tool around the transmission line until the first and second pair of cutting juts penetrate the transmission line.

* * * * *